United States Patent [19]

Wang

[11] Patent Number: 5,780,342

[45] Date of Patent: Jul. 14, 1998

[54] METHOD FOR FABRICATING DIELECTRIC FILMS FOR NON-VOLATILE ELECTRICALLY ERASABLE MEMORIES

[75] Inventor: Ping-Wei Wang, Hsinchu, Taiwan

[73] Assignee: Winbond Electronics Corporation, Taipei, Taiwan

[21] Appl. No.: 760,474

[22] Filed: Dec. 5, 1996

[51] Int. Cl.[6] ............................................. H01L 21/316
[52] U.S. Cl. ........................ 438/260; 438/585; 438/594; 438/770
[58] Field of Search .................................. 438/260, 263, 438/264, 770, 591, 594, 585, 20, 911

[56] References Cited

U.S. PATENT DOCUMENTS

| | | | |
|---|---|---|---|
| 4,377,605 | 3/1983 | Yamamoto | 438/770 |
| 4,735,919 | 4/1988 | Faraone | 438/260 |
| 4,774,202 | 9/1988 | Pan et al. | 438/260 |
| 4,814,291 | 3/1989 | Kim et al. | 438/770 |
| 4,844,248 | 7/1989 | Hashimoto | 438/770 |
| 5,429,966 | 7/1995 | Wu et al. | 438/770 |
| 5,665,620 | 9/1997 | Nguyen et al. | 438/594 |

Primary Examiner—Charles L. Bowers, Jr.
Assistant Examiner—Matthew Whipple
Attorney, Agent, or Firm—Rabin & Champagne, P.C.

[57] ABSTRACT

A method for forming a high-performance oxide as a tunneling dielectric for non-volatile memory applications. A silicon film containing amorphous silicon and good crystalline silicon micrograins is deposited in a silicon substrate by a LPCVD system. Then, a oxidation is performed at a temperature selected in a range such that non-uniform epitaxial silicon growth occurs at the silicon substrate. During an initial thermal oxidation process, the amorphous silicon region is quickly oxidized to form $SiO_2$ and the good-crystalline silicon micrograins are also quickly oxidized to form the silicon-rich $SiO_2$ (TOAS). In a following oxidation process, silicon precipitates are formed at the silicon-enriched region and the non-uniform epitaxial silicon growth is also enhanced at the silicon-enriched region. The enhanced non-uniformed silicon growth creates mild microtips. The silicon precipitates connect to the mild silicon microtips. Subsequently during the oxidation the ultrahigh and sharp microtips are formed.

9 Claims, 9 Drawing Sheets

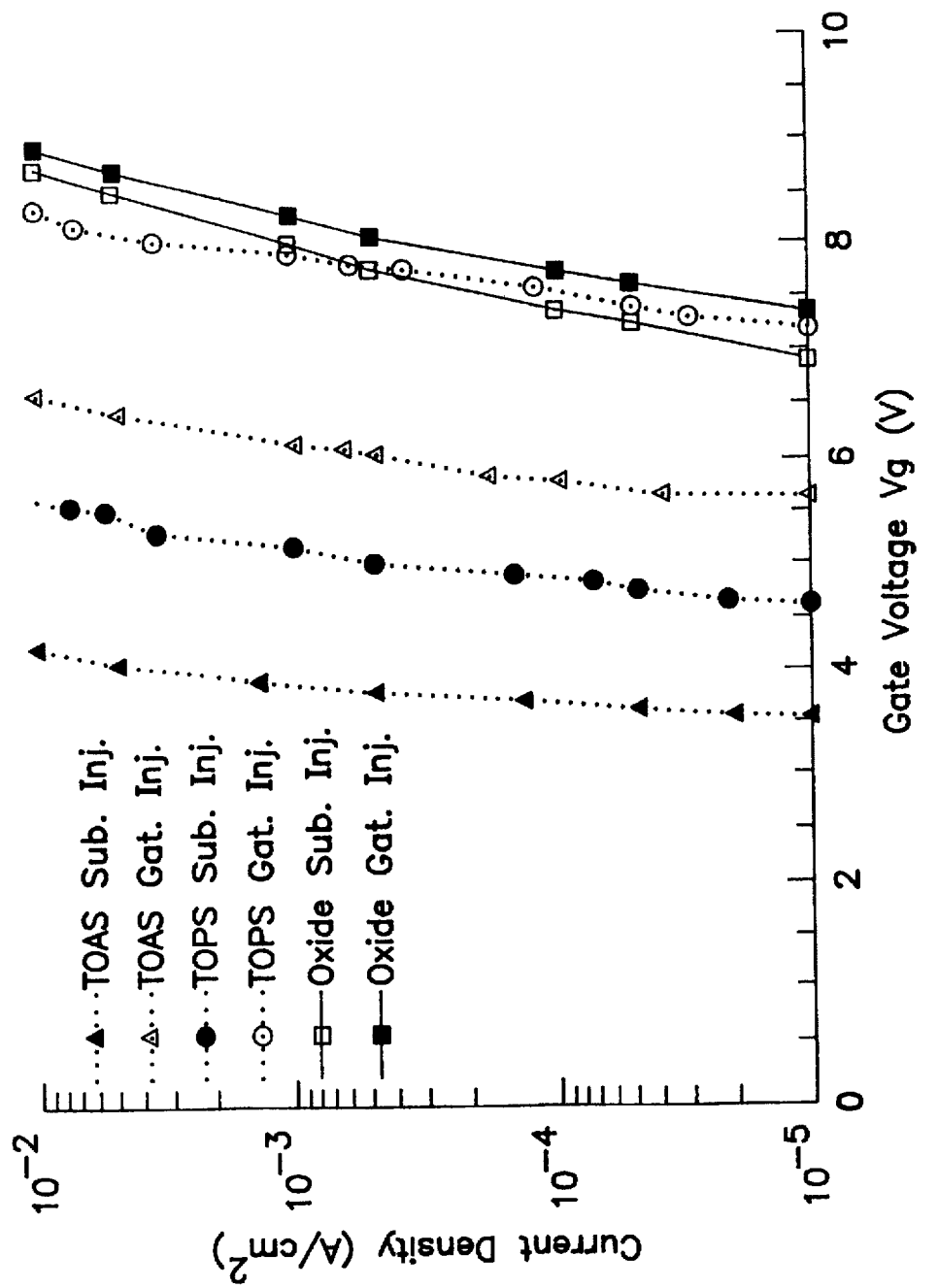

1

METHOD FOR FABRICATING DIELECTRIC FILMS FOR NON-VOLATILE ELECTRICALLY ERASABLE MEMORIES

BACKGROUND OF THE INVENTION

1. Field of the Invention

The invention generally relates to a method of fabricating a stacked gate of an electrically erasable programmable read-only memory (EEPROM). More particularly, the invention relates to method for fabricating high quality writing/erasing dielectric films during the flash EEPROM manufacturing process.

2. Technical Background

Non-volatile electrically erasable programmable read-only memory (EEPROM) devices are well known in the art. Production of high density EEPROMs requires to have scaled down device dimensions and a lowered programming voltage. However, a lower write and erase voltage for the device requires greater electron emission efficiency for the tunneling oxide. Scaling down the thin tunneling oxide thickness may result in a high defect density, low retention due to stress-induced leakage current, or charge leakage due to direct tunneling. Furthermore, reduction of oxide thickness does not directly result in high electron conduction efficiency with the espect that the electric field enhancement factor is concurrently reduced.

In order to overcome this reliability problem for thin oxide layers, the thin oxide layers may be grown by thermal oxidation on a textured single crystal silicon substrate (TSC oxide), as reported by Fong et al. (Y. Fong, A. T. Wu, R. Moazzami, P. K. Ko, and C. Hu, "Oxide grown on textured single-crystal for low programming voltage non-volatile memory application" IEDM Tech. Dig. p. 889, 1987). Such thin oxide layers exhibit a remarkable field enhancement and concurrently possess good reliability and endurance characteristics. The TSC oxide also exhibits a lower electron trapping rate than does a thick polyoxide, and exhibits better charge-to-breakdown (Qbd) characteristics than does the conventional oxide. However, the optimum texturization process must be performed by plasma etching or reactive ion etching (RIE) of an As+ or Si+ implanted substrate through a sacrificial oxide, and the depth of the etching must be at least 500 Å to obtain a satisfactory Qbd value. Also, the field enhancement factor decreases as the thickness of the TSC oxide decreases, as has been reported by M. Y. Hao et al (M. Y. Hao and J. C. Lee, "Electrical characteristics of the oxynitrides frown on textured single crystal silicon "Appl. Phys. Lett., Vol 60, p. 445, 1992).

Another method to overcome the reliability problem for thin oxide layers is disscussed in U.S. Pat. No. 5,429,966. It proposes a method that includes thermal oxidation of the polysilicon film on silicon substrate (hereinbelow, abbreviated as TOPS). Owing to the enhanced ratio of oxidation at grain boundaries, a textured $SiO_2/Si$ interface is obtained. The textured $SiO_2/Si$ interface results in localized high fields, a lower electron trapping rate and a lower interface state generation rate. However, owing to the different orientation of the deposited polysilicon film and silicon substrate and a high defect density at the interface between the polysilicon and substrate, the low-field leakage current and the low Qbd value both must both be improved.

SUMMARY OF THE INVENTION

It is therefore an object of the invention to provide a method for forming a high-performance oxide as tunneling dielectric films for non-volatile memory applications.

This is accomplished in accordance with the invention in a method for fabricating dielectric films for non-volatile electrically erasable memories, which includes the following steps:

- a thin silicon film is formed on a silicon substrate, wherein the silicon film contains amorphous silicon regions and good-crystalline silicon micrograin regions.
- thermal oxidation is then performed at a predetermined temperature for a first reaction time, such that the good-crystalline silicon micrograin regions are transformed into silicon-enriched silicon dioxide regions and then silicon precipitates are formed in the silicon-enriched silicon dioxide regions.

Simultaneously, owing to non-uniform epitaxial silicon growth at the $SiO_2/Si$ interface, mild microtips are formed, especially below the silicon-enriched silicon dioxide regions on the boundary surface of the silicon substrate.

Thermal oxidation is then continuing at the predetermined temperature for a second reaction time, such that each one of the silicon precipitates is connected with one of the mild microtips which is respectively beneath and adjacent to that silicon precipitate, to form a ultra-high and sharp microtip as a result, whereby the dielectric films with a plurality of the ultra-high and sharp microtips are formed in the non-volatile electrical erasable memories.

According to the method of the invention, the microtips are formed by epitaxial silicon growth to connect with the silicon precipitate. The silicon precipitate is formed concurrently with the epitaxial silicon mild microtips. Therefore, the orientation of the microtips is the same as that of the substrate. On the other hand, the existence of the silicon-enriched $SiO_2$ results in the formation of the silicon precipitate so that the $SiO_2/Si$ interface possesses ultra-high and sharp microtips upon completion of the oxidation process. Therefore, the electron emission efficiency (speed) of the microtips is higher, and the Qbd is better than that obtained by the conventional fabricating method.

BRIEF DESCRIPTION OF THE DRAWINGS

Other objects, features and advantages of the present invention will become apparent from the following detailed description of the preferred but non-limiting embodiment. The description is made with reference to the accompanying drawings in which:

FIG. 3 is a graph, showing plots of gate voltage versus current density for the accumulation mode of J-V characteristics of capacitors with TOAS, TOPS and pure thermal oxide dielectrics with effective oxide thicknesses of each about 80 Å;

DETAILED DESCRIPTION OF THE PREFERRED EMBODIMENT

A method for fabricating dielectric film for non-volatile electrically erasable memories (EEPROMS) according to a preferred embodiment of the invention is now described.

Figure 1A:
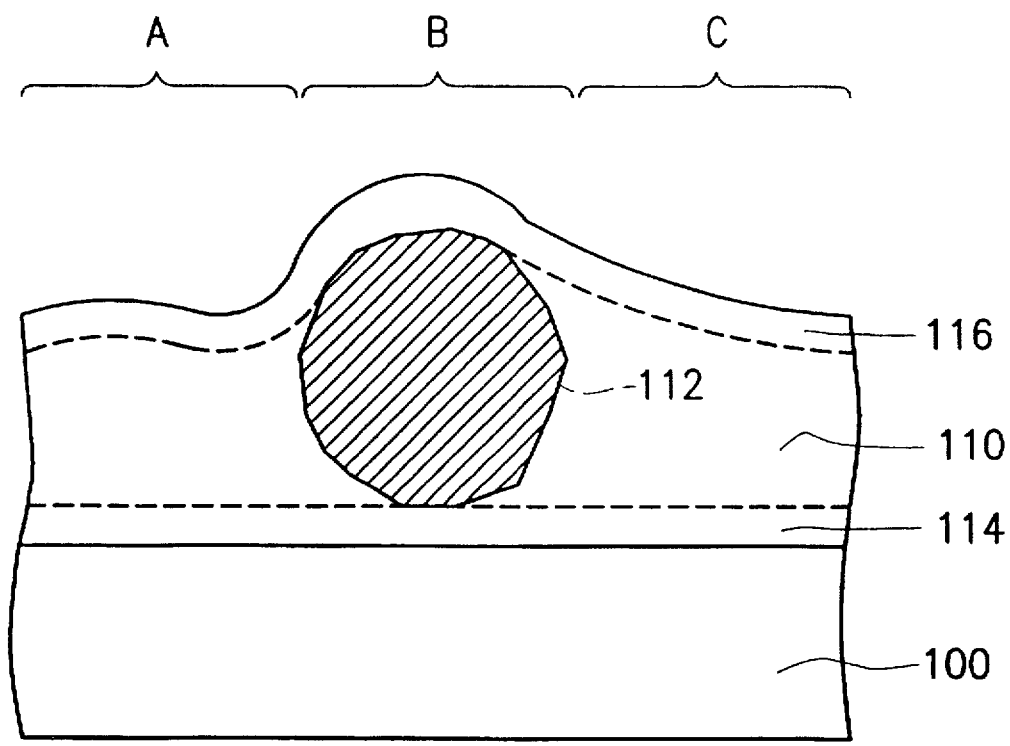
FIG. 1A to 1E are cross-sectional views of a part of an EEPROM structure illustrating the preferred process steps according to the invention.

Referring to FIG. 1A, a thin silicon film 110 with a thickness of about 40 Å containing amorphous silicon regions, for example, in regions A, C, and good-crystalline silicon micrograin regions, for example, region B between regions A, C is deposited by low-pressure chemical vapor deposition (LPCVD) on the silicon substrate 100. The thickness of the thin silicon film 110 is selected according to the thickness of a required tunneling oxide layer. For example, if the conventional thickness of a normal oxide layer is in a range from about 50 Å to 350 Å, then the thickness of the deposited thin silicon film 110 is in a range from 20 Å to 210 Å. That is, the thickness of the deposited thin silicon film 110 is equal to about 0.4 ~0.6 times the thickness of the required tunneling oxide layer needed in the EEPROMs. The thickness of the thin silicon film limits to only one the number of micrograins 112 in the thickness direction. That is there are no silicon micrograins directly above and below the other silicon micrograins. The regions 114 and 116 are boundary surfaces in the thin silicon film and the substrate 100.

Next, the substrate and the film layer are subjected to thermal oxidation. The oxidation temperature, which is predetermined according to the epitaxial silicon growth that can be performed on the silicon substrate 100, is in a range from about 750° C. to about 1100° C., for example 900° C. During the initial thermal oxidation process, for example, a first reaction time of oxidation lasting 5 minutes at 900° C., the amorphous silicon regions A and C are quickly oxidized to form $SiO_2$, and the good-crystalline silicon micrograins, such as the micrograin 120 in region B, are also quickly oxidized to form silicon-enriched $SiO_2$ (hereinbelow, abbreviated as TOAS).

Figure 1B:
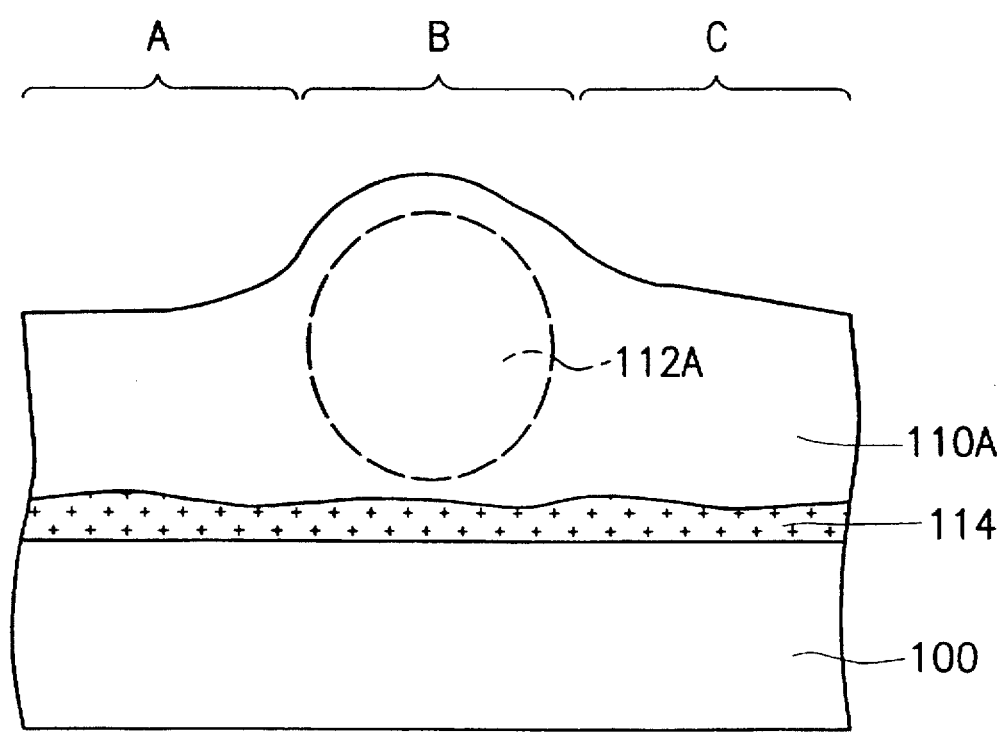
Figure 2A:
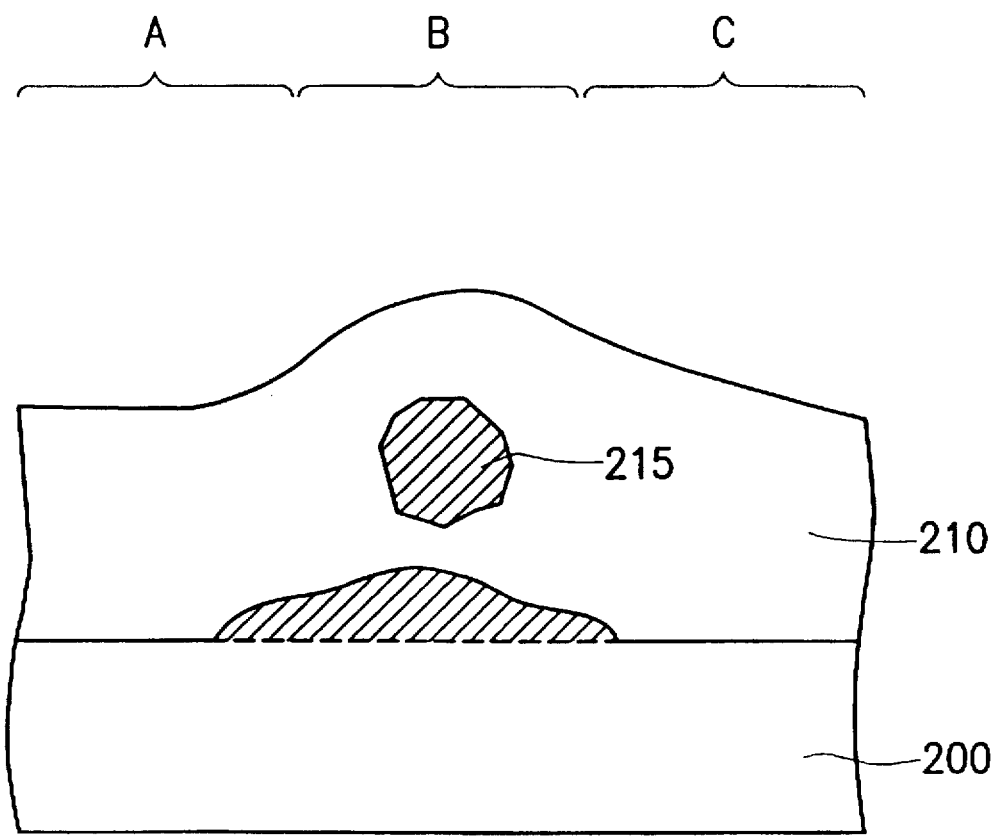
FIG. 2A to 2B is a cross-sectional view of a part of an EEPROM structure illustrating the overtime result of the process of thermal oxidation according to the invention.

After the initial stage of oxidation, referring to FIG. 1B, there is a layer of 40 Å-thick TOAS 110A generated on the substrate 100. At the same time, a high-defect epitaxial silicon 120 is simultaneously formed on the substrate 100. The good crystalline silicon micrograin region B will form the silicon-enriched $SiO_2$ 112A upon completion of the oxidation process. The presence of the silicon-enriched oxide described above can be demonstrated by a separate experiment. The initial oxidized specimen as shown in FIG. 2A is annealed at 900° C. for 20 minutes. After annealing, silicon precipitates 215 are found in the $SiO_2$ layer TOAS 210.

Figure 1C:
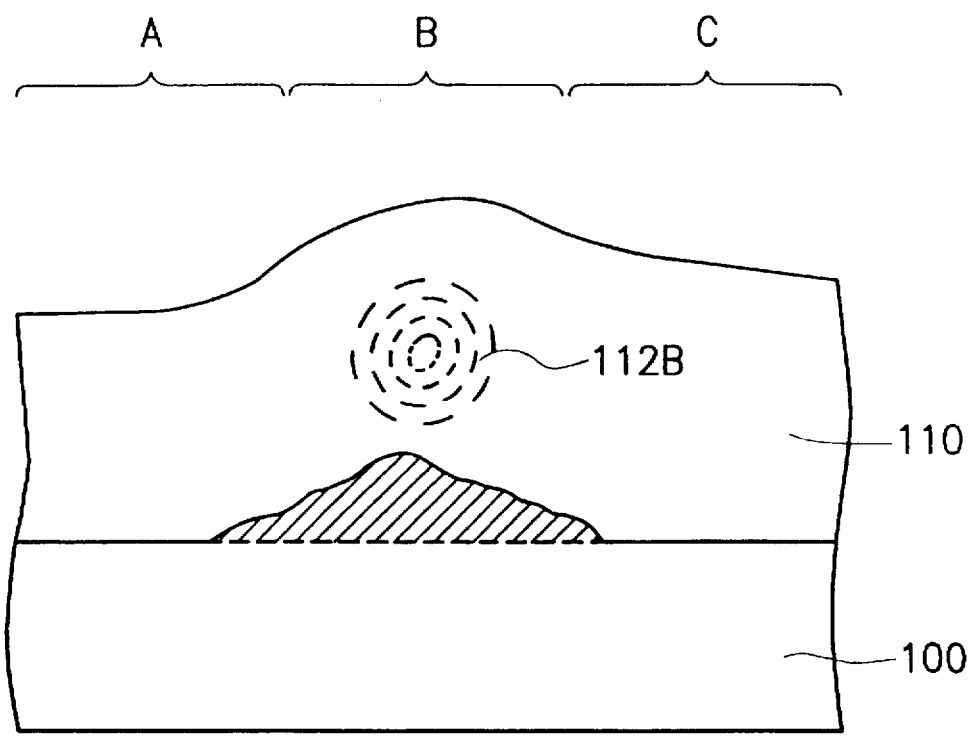

Referring to FIG. 1C, during a following second reaction time of, for example, 4 minutes at 900° C., during which oxidation lasting for 9 minutes at 900° C., silicon precipitates 112B are formed in the silicon-enriched region B. At the same time, owing to the non-uniform epitaxial silicon growth on the substrate 100 being enhanced in the silicon-enriched region B, mild microtips 130 are formed on the substrate 100 beneath and adjacent to the silicon-enriched region B.

Figure 1D:
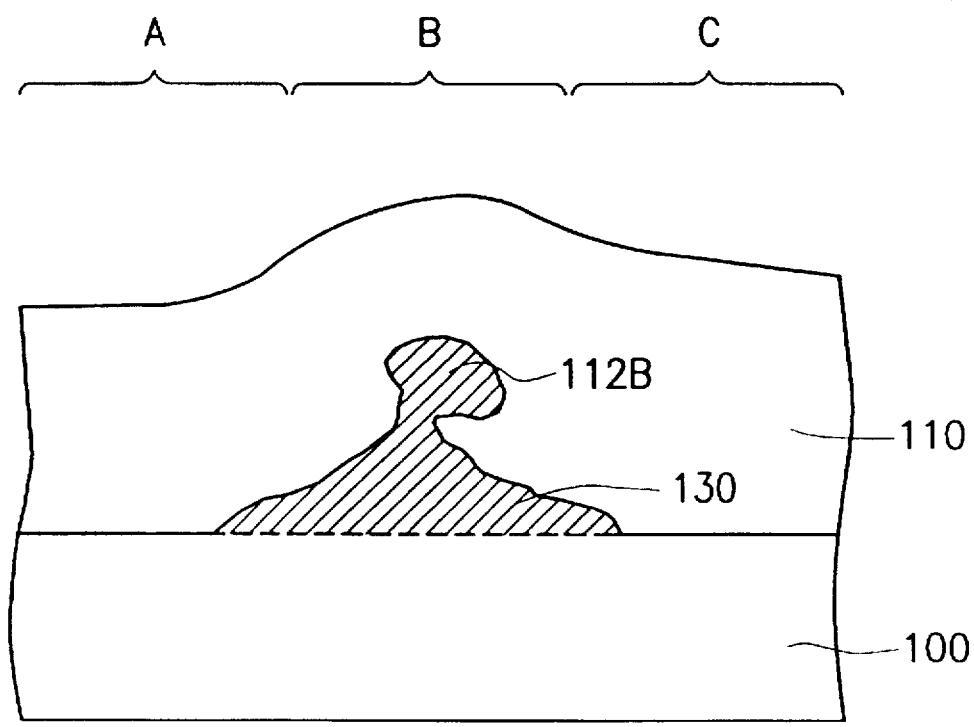

In FIG. 1D, when the oxidation time is extended further, for example, the oxidation time has reached 10 minutes at 900° C. for the 40 Å-thick TOAS, the silicon precipitates 112B are gradually connected with the mild microtips 130 during the tenth minute.

Figure 1E:
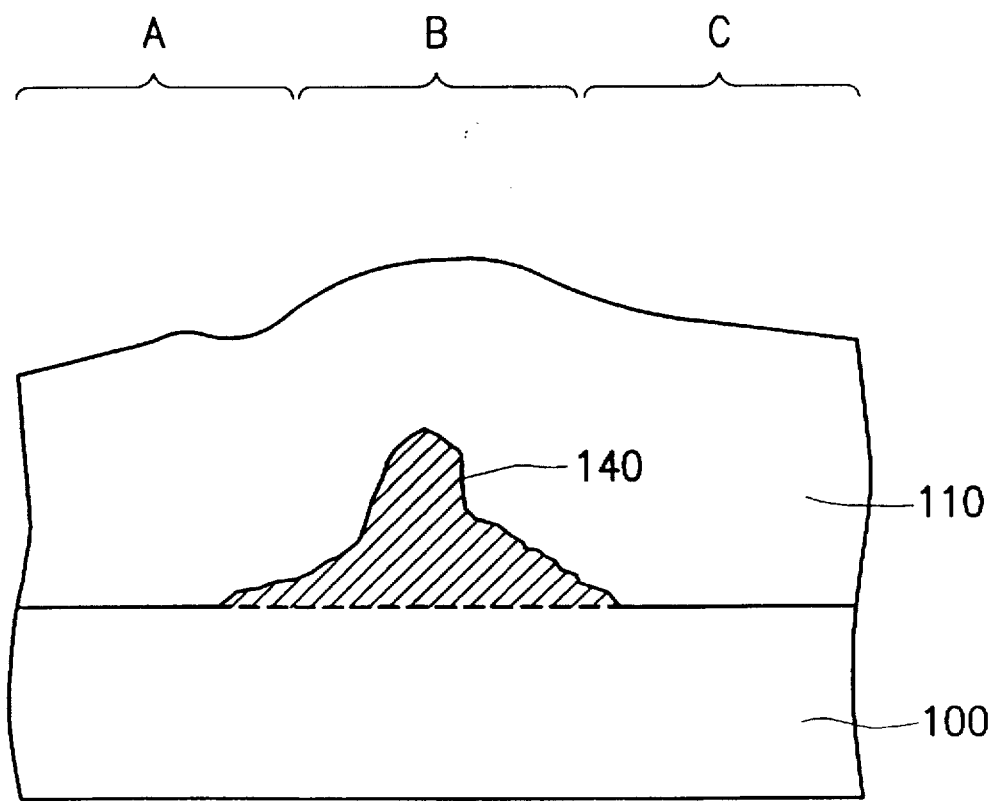

As shown in FIG. 1E, when the oxidation procedure is optimized, for example, when the oxidation time is set to 15 minutes at 900° C. for the 40 Å-thick TOAS, the silicon atoms will migrate (during the last minutes) so that the silicon precipitates connect thoroughly with the mild microtips to form sharp, ultra-high microtips 140. Therefore, the optimum condition for the oxidation is established by setting the total oxidation action time such that the deposited silicon film is completely oxidized.

Figure 2B:
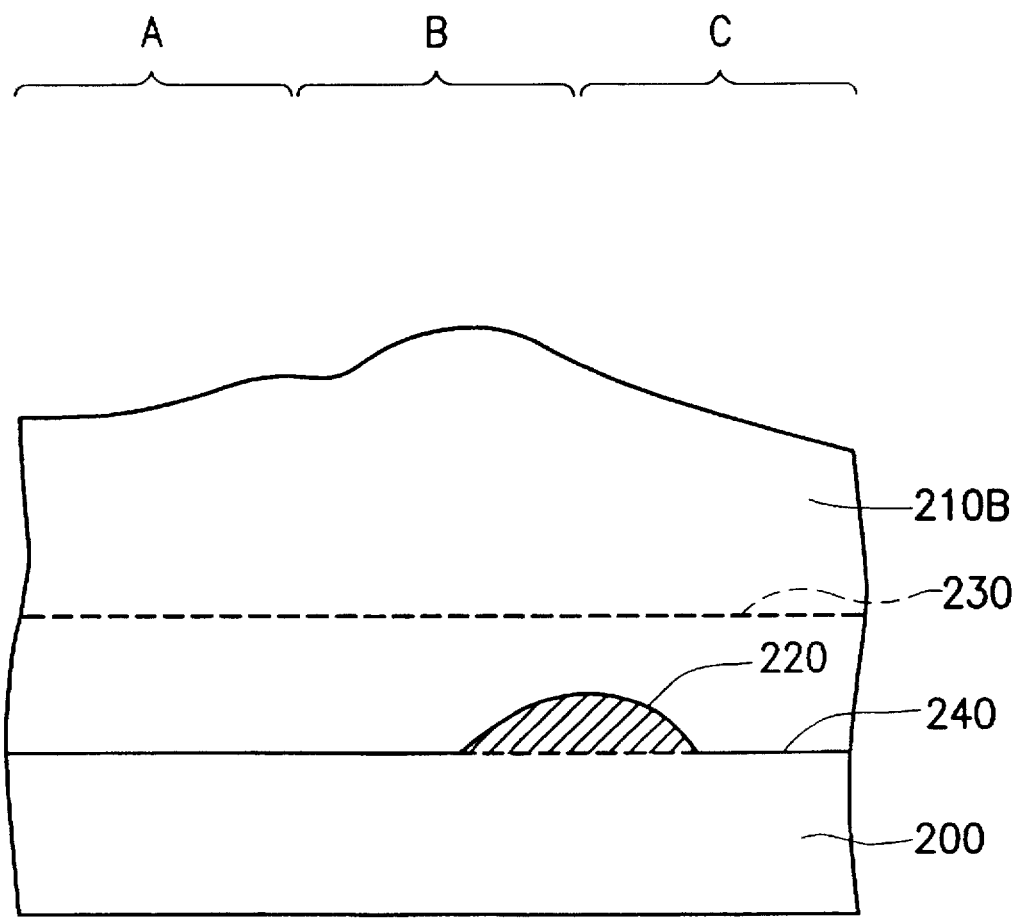

Referring to FIG. 2B, showing the result of extended thermal oxidation beyond that provided according to this invention, for example, an oxidation time of 30 minutes at 900° C. for the 40 Å-thick TOAS, is that small microtips 220 are formed on substrate 200. An effect of such thermal oxidation is that the boundary line 240 between the substrate 200 and the formed $SiO_2$ layer 210B is below the initial silicon surface 230. Thus, it is very important that the oxidation should be terminated at the appropriate time.

All of the oxidation process illustrated in FIG. 1A to FIG. 1E. From the above-described figures, it is clear that the optimum duration of oxidation is that by which all of the deposited silicon is consumed during the oxidation. That means that the thickness of the deposited silicon film is determined by the required oxide thickness. Owing to the known rate, the ratio of the thickness of the silicon oxide compared to the thickness of the consumed silicon is about 1:0.45. For example, if the desired oxide thickness is 80 Å, then the thickness of the deposited silicon layer should be about 36 Å. The duration of the oxidation, that is, the sum of the first and second reaction times, may for example, be in a range from 8 to 100 minutes, depending on the oxidation temperature.

Referring to FIG.3, there is shown a graph plots of gate voltage versus current density of J-V characteristics of the capacitors having TOAS, TOPS and pure thermal oxide dielectrics layers with effective oxide thicknesses of about 80 Å. It is seen that the electron injection efficiency (rate or speed) of the TOAS capacitor is much higher than that of the pure thermal oxide capacitor and that of the TOPS capacitor for both injection polarities. For example, at a current density of 10 $mA/cm^2$, the substrate injection voltage of the pure thermal oxide is 9 V, that of the TOPS is 5.7 V and that of the TOAS is 4.2 V. The presence of sharp, ultra-high microtips on the substrate injection surface is the reason for the field enhancement that accesses the higher injection efficiency. On the other hand, the electron injection from the gate side of the capacitor is lower than that from the substrate, which can be explained by the fact of degree of texturization of the substrate is higher than that of the gate.

Figure 4:
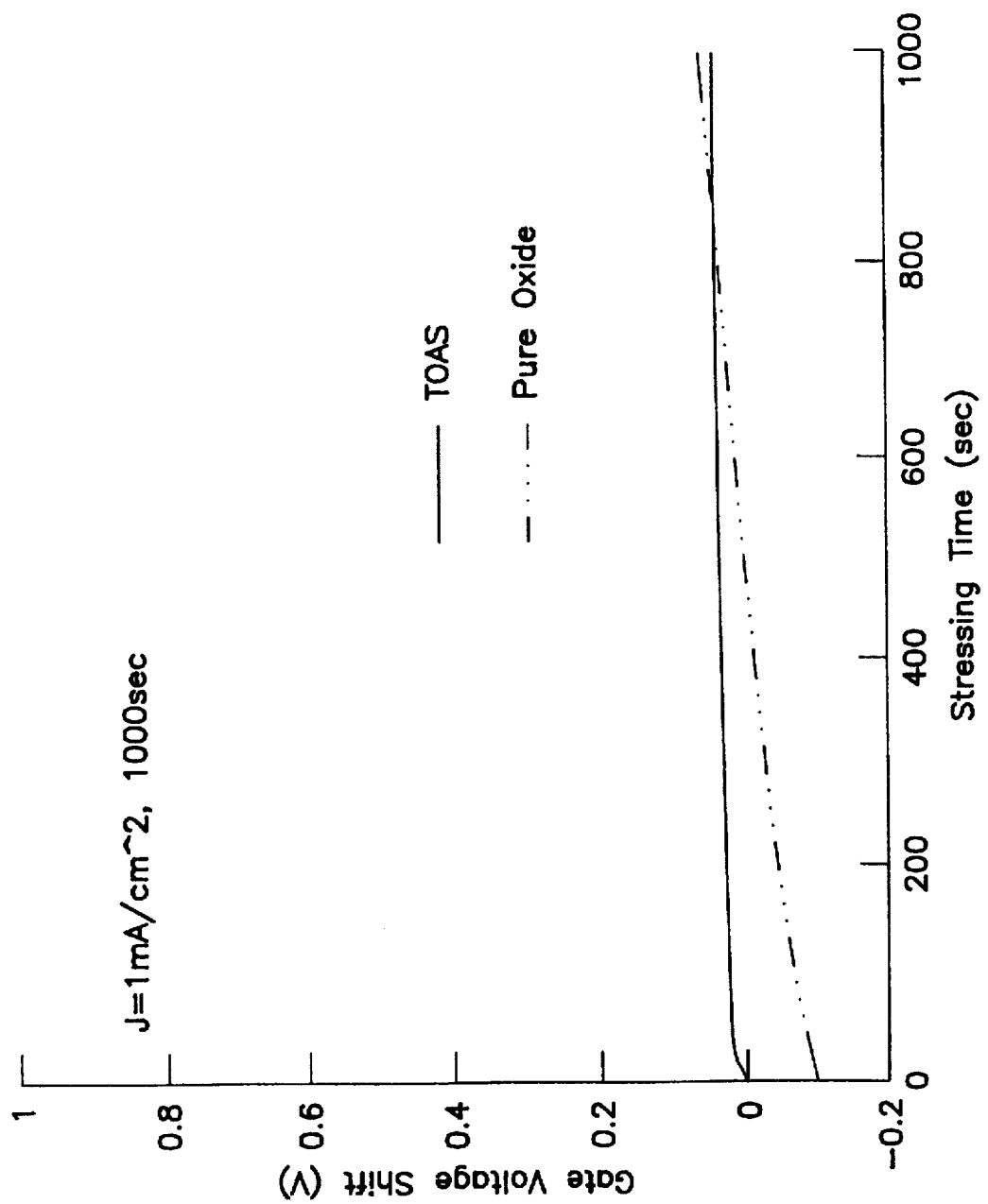
FIG. 4 is a graph, showing plots of gate voltage shift versus current stress time for the TOAS and the pure oxide.

FIG. 4 is a graph, showing plots of gate voltage shift versus stress time for the TOAS and the pure thermal oxide capacitors. It is seen that the TOAS capacitor possesses a small degree of electron trapping behavior, whereas the pure oxide capacitor, over the stress time, possesses hole trapping characteristics and then electron trapping characteristics.

Figure 5:
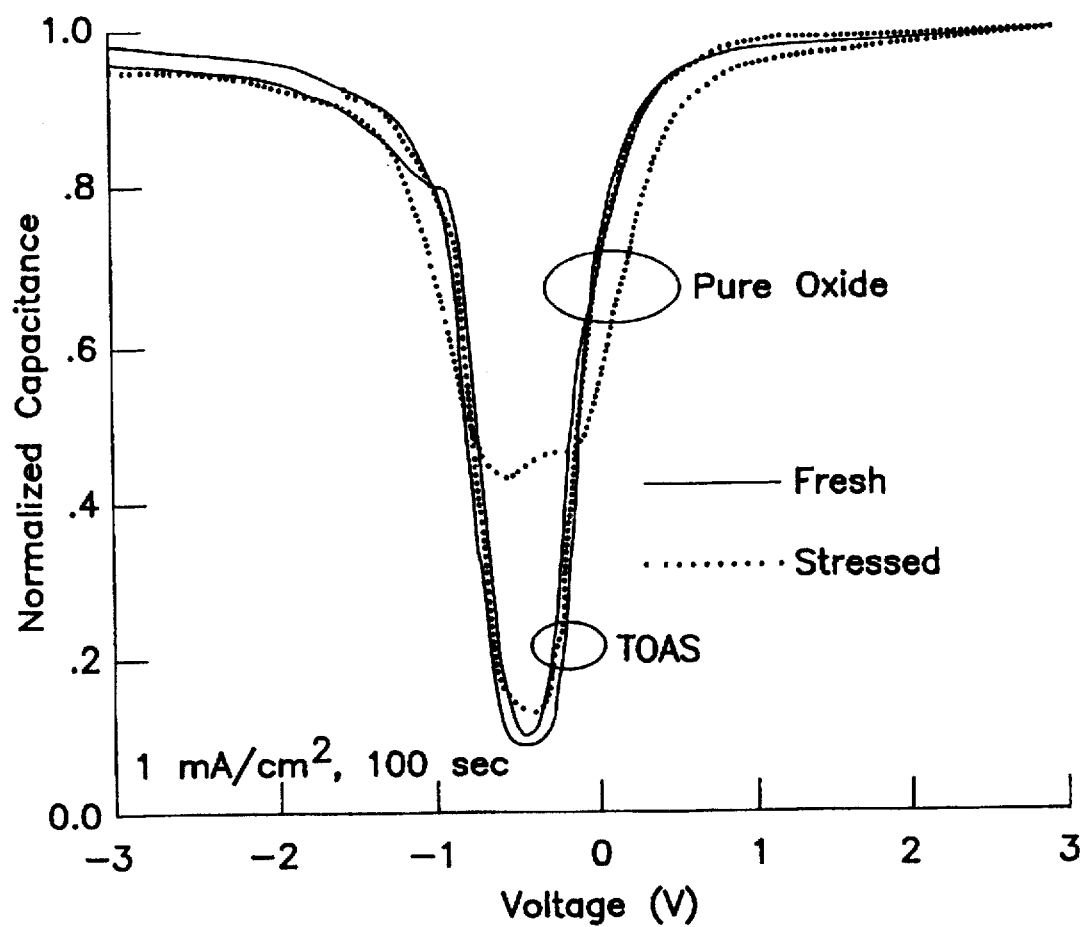
FIG. 5 is a graph, showing plots of the quasi-static C-V characteristics of TOAS and pure oxide before and after a constant current stress of 1 $mA/cm^2$ for 100 seconds.

FIG. 5 shows quasi-static C-V characteristics of the TOAS and pure oxide capacitors before and after a constant current stress of 1 $mA/cm^2$ for 100 seconds. For the TOAS capacitor, there is no significant degradation of the C-V curve after stressing.

Figure 6:
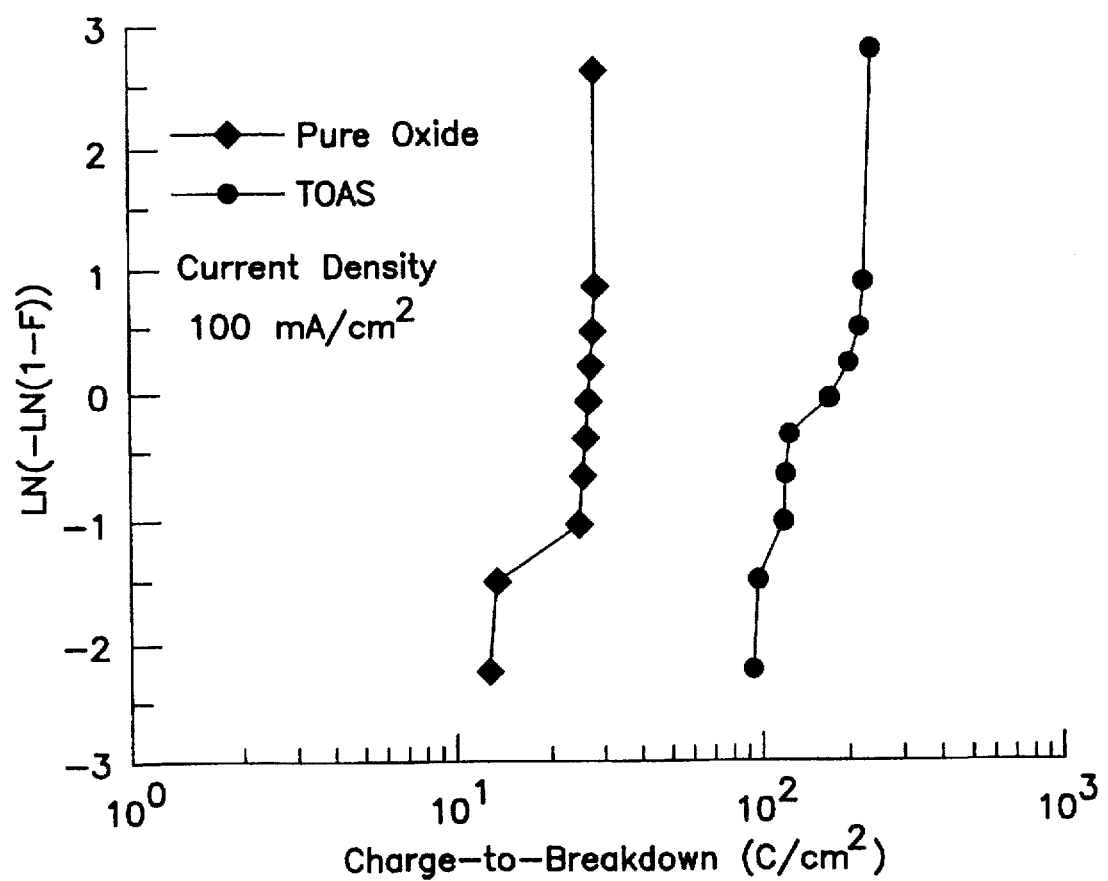
FIG. 6 is a graph, showing plots of Qbd characteristics for capacitors with the TOAS and pure thermal oxide dielectrics.

FIG. 6 shows the Qbd characteristics for the TOAS capacitor and the pure thermal oxide capacitor. The testing area is $2.56 \times 10^{-4}$ $cm^{-2}$. The charge-to-breakdown for the TOAS is about one order larger than that of the pure oxide capacitor.

In this invention, the microtips are formed by epitaxial silicon growth connection with the silicon precipitate. The silicon precipitate is formed concurrently with the epitaxial silicon mild microtips. Therefore, the orientation of the microtips is the same as that of the substrate. On the other hand, the existence of the silicon-enriched $SiO_2$ will result in the formation of silicon precipitate and then the $SiO_2$/Si interface possessing the sharp, ultra-high microtips. Therefore, the electron emission efficiency of the microtips is high and the Qbd charactristics are good.

The differences between the invention and the conventional fabricating method may be summaried as follows:

(1) the original silicon film used in the conventional method contains only polysilicon or amorphous silicon, while the original silicon film used according to the invention contains both amorphous silicon and good crystalline silicon micrograins; and (2) during the process of thermal oxidation, the conventional method for oxidation is "enhanced grain boundary oxidation", whereas the invention performs "non-uniform epitaxial growth" and forms "silicon precipitates" concurrently.

As a result of these differences, the invention provides the following advantages:

(1) the orientation of generated microtips over the substrate is different from the orientation of the substrate, according to the conventional method, whereas according to the invention, the silicon atoms migrate so that the silicon precipitates thoroughly connect epitaxially with the mild microtips, to form the sharp, ultra-high microtips, so the problem of different orientation will not occur; and (2) the generated tips obtained by the conventional method are not sharp enough to meet the need to improve the electron emission efficiency, whereas according to the invention, by merger of the silicon precipitates and the mild silicon microtips, there is a distinct improvement in the electron emission efficiency.

While the invention has been described by way of example and in terms of a preferred embodiment, it is to be understood that the invention is not limited to the disclosed embodiment. To the contrary, it is intended to cover various modifications and similar arrangements. Therefore, the scope of the appended claims should be accorded the broadest interpretation so as to encompass all such modifications and similar arrangements.

What is claimed is:

1. A method for fabricating dielectric films for non-volatile electrically erasable memories, comprising:

forming a thin silicon film on a silicon substrate, wherein the silicon film contains amorphous silicon regions and crystalline silicon micrograin regions;

thermally oxidizing the thin film for a first reaction time, such that the crystalline silicon micrograin regions are transformed into silicon-enriched silicon dioxide regions and then silicon precipitates are formed in the silicon-enriched silicon dioxide regions and a plurality of mild microtips are formed below the silicon-enriched silicon dioxide regions on a boundary surface of the silicon substrate with the thin film; and after the first reaction time, further thermally oxidizing the thin film for a second reaction time such that the silicon precipitates connect with mild microtips among the mild microtips formed during the first reaction time, which are beneath and adjacent to the above-mentioned silicon precipitates, to form microtips, whereby dielectric films with a plurality of the microtips are formed.

2. The method as claimed in claim 1, wherein said forming a thin silicon film includes forming the amorphous silicon regions and the crystalline silicon micrograins of the thin silicon film by low-pressure chemical vapor deposition.

3. The method as claimed in claim 1, wherein the forming a thin silicon film and the thermally oxidizing for a first reaction time include forming a thin silicon film and the mild microtips such that a ratio of the thickness of the thin silicon film to the thickness of the dielectric films formed during the further thermally oxidizing is in a range from about 0.4 to about 0.6.

4. The method as claimed in claim 3, wherein the thickness of the thin silicon film is in a range from 20 Å to 210 Å, and wherein the thickness of the dielectric film is in a range from 50 Å to 350 Å, whereby only one crystalline silicon micrograin is formed in the direction of the thickness of the thin silicon film.

5. The method as claimed in claim 1, wherein the thermal oxidization performed during the first and second reaction times is at a temperature selected from the range of 750° C. to 1100° C.

6. The method as claimed in claim 1, further comprising selecting a temperature at which to thermally oxidize the thin film during the first and second reaction times, wherein a sum of the first reaction time and the second reaction time is in a range from about 8 minutes to about 100 minutes, according to the selected temperature.

7. The method as claimed in claim 1, wherein the thermal oxidation performed during the first reaction time is at an oxidation temperature, and the thermal oxidation performed during the second reaction time is at the oxidation temperature at which the thermal oxidation is performed during the first reaction time.

8. The method as claimed in claim 1, wherein the further thermally oxidizing the thin film for a second reaction time such that the silicon precipitates connect with mild microtips which are beneath and adjacent to the silicon precipitates, form microtips which are higher and sharper than the mild microtips, whereby dielectric films with a plurality of the higher and sharper microtips are formed.

9. The method as claimed in claim 1, wherein the crystalline oxidation performed during the first reaction time is at an oxidation temperature, and the thermal oxidation performed during the second reaction time is at an oxidation temperature, and the thermal oxidation performed during the second reaction time is at the oxidation temperature at which the thermal oxidation is performed during the first reaction time; and the further thermally oxidizing the thin film for a second reaction time such that the silicon precipitates connect with mild microtips which are beneath and adjacent to the silicon precipitates, form microtips which are higher and sharper than the mild microtips, whereby dielectric films with a plurality of the higher and sharper microtips are formed.

* * * * *